United States Patent [19]
Zublin et al.

[11] 4,048,588
[45] Sept. 13, 1977

[54] YIG-TUNED BULK SEMICONDUCTOR OSCILLATOR

[75] Inventors: Kurt E. Zublin, Los Altos; Walter T. Wilser, Cupertino, both of Calif.

[73] Assignee: Watkins-Johnson Company, Palo Alto, Calif.

[21] Appl. No.: 675,245

[22] Filed: Apr. 8, 1976

[51] Int. Cl.² .......................... H03B 7/14; H03B 9/12
[52] U.S. Cl. .............................. 331/96; 331/107 G; 331/177 R
[58] Field of Search .............. 331/96, 107 R, 107 G, 331/177 R

[56] References Cited
U.S. PATENT DOCUMENTS 3,546,624  12/1970  Omori .............................. 331/107 G
3,576,503  4/1971   Hanson ............................. 331/96

Primary Examiner—Siegfried H. Grimm

[57] ABSTRACT

A bulk semiconductor oscillator subassembly is carried on a support pin. The oscillator assembly includes a semiconductor diode mounted on the pin with one terminal connected thereto. The other terminal is connected to one end of an input coupling loop which has its other end connected to the pin through a by-pass capacitor. Biasing voltages are applied to the diode via a lead connected to the loop. The loop is coupled to a Yttrium Iron Garnet (YIG) sphere which serves as a resonator. The resonant frequency of the resonator is tuned by adjusting a DC magnetic field applied thereto. The output is obtained by an output loop which is located orthogonally with respect to the input loop and coupled to the YIG whereby the input and output loops are coupled through the YIG resonator.

6 Claims, 3 Drawing Figures

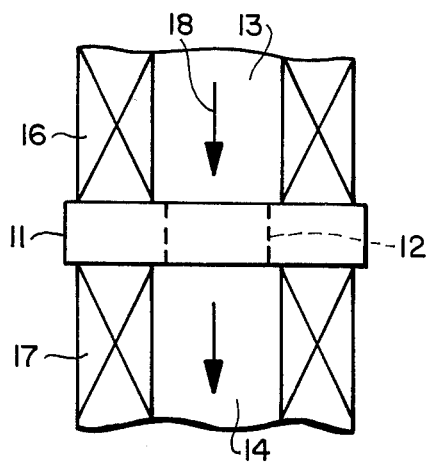
FIG_1
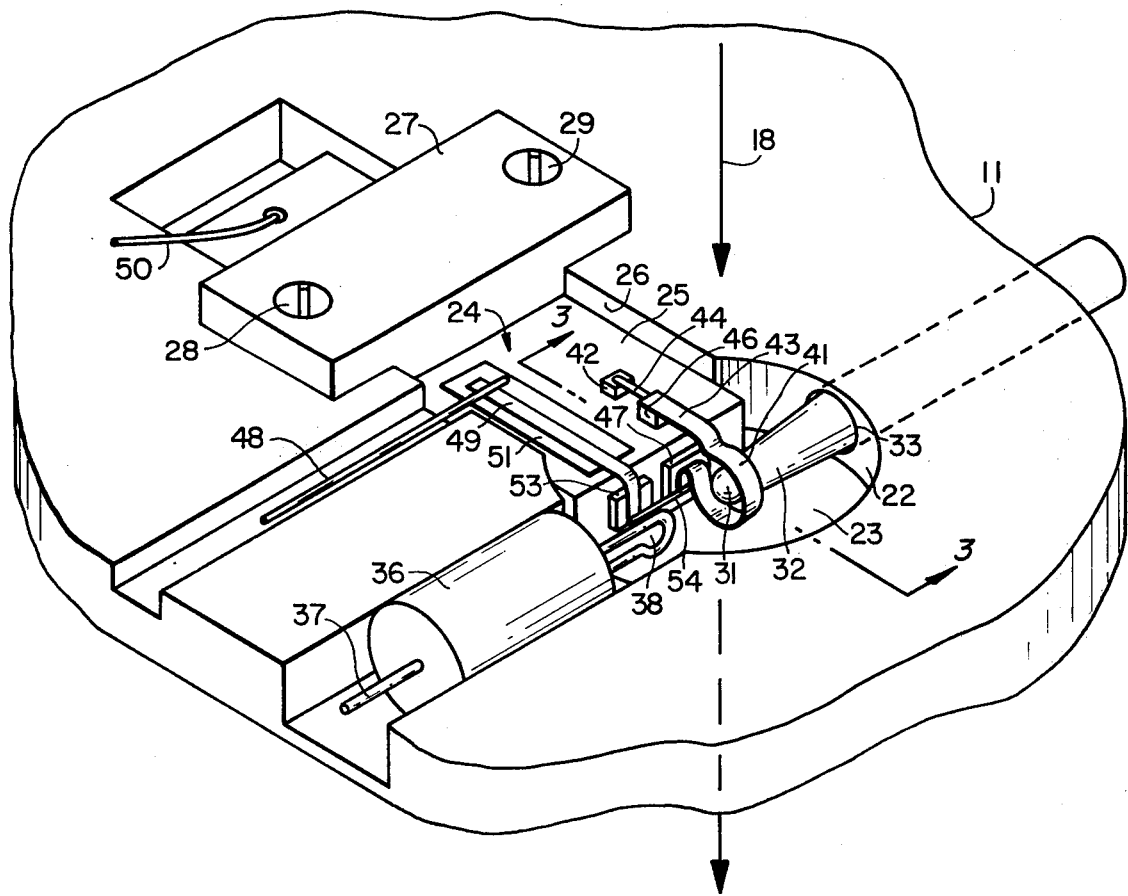
FIG_2

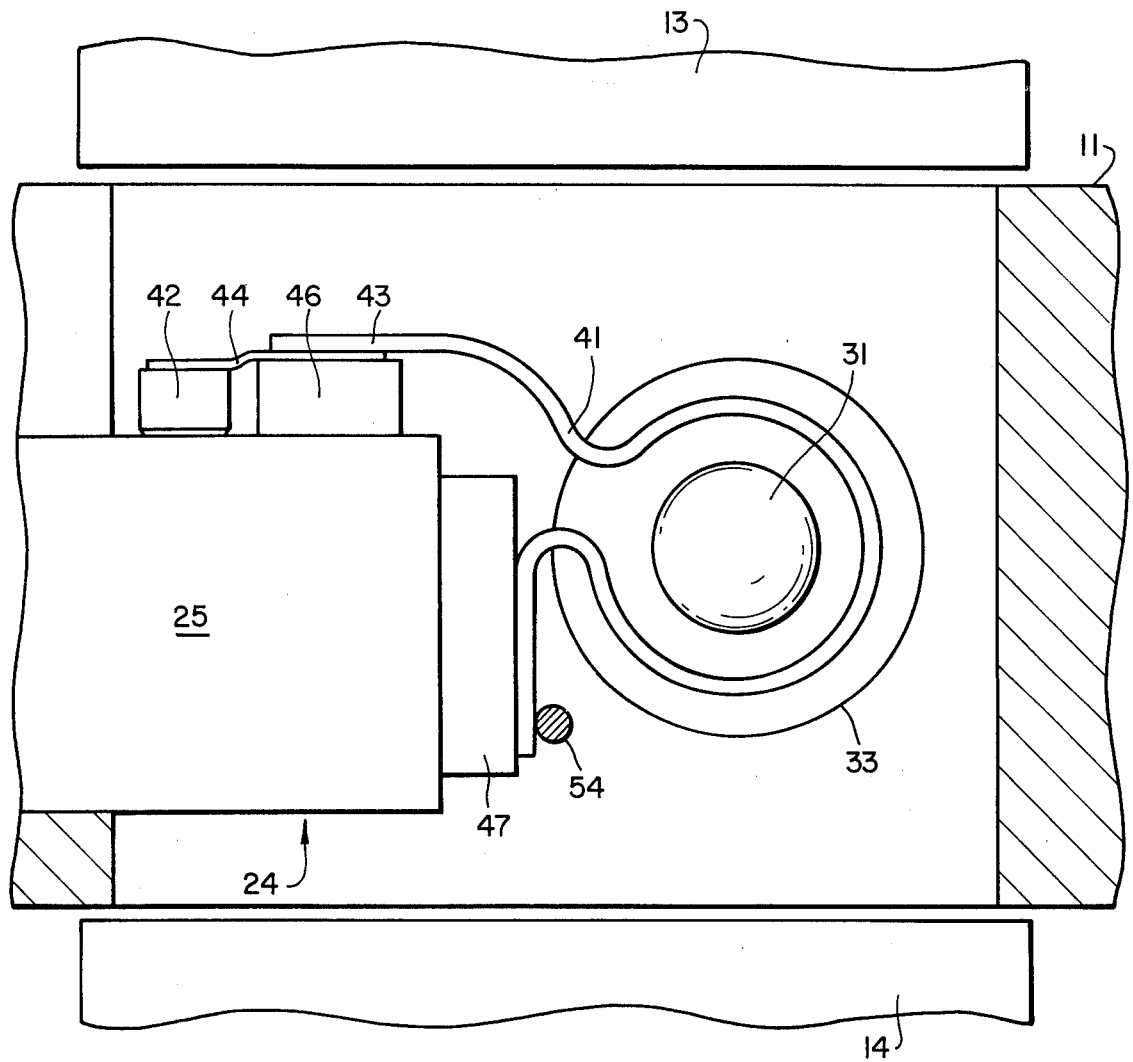
FIG_3

YIG-TUNED BULK SEMICONDUCTOR OSCILLATOR

BACKGROUND OF THE INVENTION

This invention relates generally to a YIG-tuned bulk semiconductor oscillator.

YIG-tuned bulk semiconductors are known in the art. They have been relatively complex and difficult to assemble.

OBJECTS AND SUMMARY OF THE INVENTION

It is a general object of the present invention to provide a YIG-tuned bulk semiconductor oscillator which is simple in construction and easy to assemble.

It is another object of the present invention to provide a YIG-tuned bulk semiconductor oscillator in which the semiconductor diode, input loop and associated isolation capacitors are mounted on a pin as a sub-assembly which is inserted into the cavity.

It is a further object of the present invention to provide a YIG-tuned bulk semiconductor oscillator in which the path of the rf current returned to the semiconductor in minimized.

These and other objects of the invention are achieved by an oscillator comprising an isolation cavity; a semiconductor diode subassembly including a conductive support for receiving and holding one terminal of said diode, a coupling loop having one end secured to the other terminal of said diode and having its other end coupled to the conductive support by a capacitor disposed with the coupling loop in said cavity; a microwave resonator disposed in said cavity and coupled to said loop; and, an output loop orthogonally oriented with respect to the input loop coupled to said resonator to provide the oscillator output.

BRIEF DESCRIPTION OF THE DRAWINGS

FIG. 1 is a schematic diagram of electromagnet associated with the YIG-tuned bulk semiconductor oscillator support and cavity.

FIG. 2 is a perspective view showing the oscillator support and cavity.

FIG. 3 is a sectional view taken along lines 3—3 of FIG. 2.

DESCRIPTION OF PREFERRED EMBODIMENTS

The oscillator is supported by a conductive body 11, FIG. 1, which contains an isolation cavity 12 which is more clearly described with reference to FIGS. 2 and 3. Disposed adjacent the upper and lower walls of the cavity are magnetic pole pieces 13 and 14 which form the pole pieces for the electromagnets which include coils 16 and 17. The magnetic field generated by the electromagnet is shown as being in the direction of the arrows 18 and has a magnetic field strength which is dependent upon the current flowing through the coils 16 and 17. As is well known, the magnetic field is uniform across the cavity and the strength is varied to tune the oscillator.

Referring to FIGS. 2 and 3, the oscillator includes the support structure 11 which is provided with an opening 22 which, together with the faces of the opposed pole pieces, forms an isolation cavity 23. The cavity serves to enclose the rf oscillator components or circuits. The cavity suppresses radiation losses from the rf circuits within the cavity. The support structure 11 also serves as a heat sink for the diode pin subassembly 24 disposed in groove 26 and clamped to the support by means of the clamp 27 secured to the support by screws 28 and 29.

The support structure 11 also accommodates a resonator 31, preferably a YIG sphere, mounted on the end of a dielectric rod 32 having a tapered end which extends through the hole 33 formed in the structure 11. The rod 32 may be moved axially or rotated to position the sphere 31 within the input coupling loop to be presently described. A coaxial output line 36 has its inner conductor 37 connected to one end of an output loop 38 while the other end of the loop is connected to the ground or outer terminal of the coaxial conductor. The coupling loop 38 serves to provide the oscillator output.

The YIG sphere 31 presents a microwave oscillator which is tuned by the applied magnetic field 18 and which is coupled by means of an input loop 41 to a semiconductor diode 42, preferably a GaAs diode. The diode 42 has one terminal bonded to the support pin 25 and its other terminal connected to strap 43 by lead 44. The strap extends outwardly and is bent to form input coupling loop 41. The junction between the lead 44 and the strap is supported by insulator 46. The other end of the input loop 41 is returned to the pin 24 via a bypass capacitor 47. Bias current is applied to the diode via loop 41 by means of an insulated wire 48 connected to a strap 49 isolated from the pin 24 by insulating material 51 and extends downwardly to the upper surface of bypass capacitor 53. A wire or other suitable connection 54 connects the strap 49 to the loop 41 whereby to provide bias voltage to the upper terminal of the diode 42. The other terminal of the diode is connected through the pin 25 to a lead 50. Bias voltage is applied across the diode through the leads 48 and 50. The voltage causes the diode to oscillate in the bulk oscillation mode. More specifically, current oscillations are caused by space charge instability in the active region of the diode and is referred to as transferred electron effect. The frequency band of oscillation of the oscillator is determined by the length of the active region.

The coupling of the YIG sphere 41 to the diode 42 is adjusted by means of the input loop diameter. The coupling of the output loop 38 to the YIG 31 is adjusted by the proximity of the loop to the YIG sphere. The resonator 41 is tuned to a frequency within the broadband diode oscillator frequency and consequently resonates at that frequency and discriminates against all other frequencies. As described above, the frequency is selected by controlling the magnetic field.

The axes of the input and output loops are orthogonal to each other whereby, in the absence of the YIG sphere, there is no coupling between the input and output loops. The output loop is coupled to the resonator and as such couples out that frequency from the diode and no other frequency.

The magnetic tuning field is at right angles to the plane comprising the two-loop axis. This condition is essential for proper electrical performance of the oscillator. The electrical current across the diode chip is parallel with the applied magnetic field. This mounting configuration of diode chip is preferable at high frequency operation where the magnetic tuning field is relatively high. The operation of the diode subassembly is independent of the isolation cavity because the return path of the rf current through the coupling loop is directly to the diode. The purpose of the cavity is to eliminate radiation losses of the device. The physical configuration of the cavity is such that its resonant frequency falls outside the operating frequency range of the oscillator. The self-resonance of the coupling structure created by the parasitic semiconductor capacitance and self-inductance of the coupling loop is well above the operating frequency of the device and minimizes parasitic oscillations. The diode is oriented in such a way that the magnetic field lines are essentially parallel to the current path through the diode to minimize the effect of magneto resistance.

Thus, there is provided an improved, simple, easy to assemble YIG-tuned GaAs oscillator.

What is claimed is:

1. A diode oscillator comprising a support structure; an isolation cavity partly defined by said support structure; a diode subassembly mounted on said support structure, said subassembly including a semiconductor diode having two terminals, a conductive support pin for receiving and holding one terminal of said diode, a coupling loop carried by said support pin having one end secured to the other terminal of said diode, and a capacitor mounted on said conductive support pin for supporting and capacitively coupling the other end of the loop to the conductive support pin, said subassembly extending into the cavity; a resonator within said cavity disposed in coupled relationship to said loop; means for applying a uniform magnetic field to said resonator; and, an output loop disposed in said cavity and oriented orthogonally with respect to said input loop and serving to be coupled to the electromagnetic fields at said resonator to provide an output.

2. A diode oscillator as in claim 1 in which said diode is a gallium arsenide diode and said resonator is a yttrium iron garnet sphere.

3. A diode oscillator as in claim 2 in which the diode is oriented so that the current flowing between the terminals is parallel to the magnetic field.

4. A diode oscillator comprising an isolation cavity; a separate diode subassembly including a semiconductor diode having first and second terminals, an elongated conductive support for receiving and supporting said diode with one terminal of said diode connected to said support, a coupling loop having one end secured to the other terminal of said diode, a capacitor carried by one end of said support and adapted to receive and support the other end of said coupling loop to capacitively couple the other end of said loop to the end of said conductive support; means for supporting said diode subassembly so that at least the loop extends into said cavity; a resonator disposed in coupled relationship to said loop; means for applying a voltage across said diode via said loop; means for applying a uniform magnetic field to said resonator; and, an output loop disposed orthogonally to said input loop and coupled to the electromagnetic fields at said resonator to provide an output.

5. A diode oscillator as in claim 4 in which said diode is a gallium arsenide diode and said resonator is a yttrium iron garnet shpere.

6. A diode oscillator as in claim 5 in which the diode is oriented so that the current flowing between the terminals is parallel to the magnetic field.

* * * * *